United States Patent
Dünkel et al.

(10) Patent No.: US 11,817,457 B2
(45) Date of Patent: Nov. 14, 2023

(54) RECONFIGURABLE COMPLEMENTARY METAL OXIDE SEMICONDUCTOR DEVICE AND METHOD

(71) Applicant: GLOBALFOUNDRIES Dresden Module One Limited Liability Company & Co. KG, Dresden (DE)

(72) Inventors: Stefan Dünkel, Dresden (DE); Dominik M. Kleimaier, Dresden (DE)

(73) Assignee: GlobalFoundries Dresden Module One Limited Liability Company & Co. KG, Dresden (DE)

( * ) Notice: Subject to any disclaimer, the term of this patent is extended or adjusted under 35 U.S.C. 154(b) by 241 days.

(21) Appl. No.: 17/143,202

(22) Filed: Jan. 7, 2021

(65) Prior Publication Data
US 2022/0216237 A1 Jul. 7, 2022

(51) Int. Cl.
*H01L 29/78* (2006.01)
*H01L 27/118* (2006.01)
(Continued)

(52) U.S. Cl.
CPC .... *H01L 27/11807* (2013.01); *H01L 29/6684* (2013.01); *H01L 29/66825* (2013.01);
(Continued)

(58) Field of Classification Search
None
See application file for complete search history.

(56) References Cited

U.S. PATENT DOCUMENTS

| | | | | |
|---|---|---|---|---|
| 7,212,446 B2 * | 5/2007 | Diorio | | G11C 16/3468 |
| | | | | 365/185.21 |
| 8,363,445 B2 * | 1/2013 | Hui | | G11C 17/18 |
| | | | | 365/104 |

(Continued)

OTHER PUBLICATIONS

Mulaosmanovic et al., "Reconfigurable Frequency Multiplication with a Ferroelectric Transistor", Nature Electronics, vol. 3, 2020, pp. 391-397.
(Continued)

*Primary Examiner* — Bilkis Jahan
(74) *Attorney, Agent, or Firm* — Yee Tze Lim; Hoffman Warnick LLC

(57) ABSTRACT

Disclosed is a reconfigurable complementary metal oxide semiconductor (CMOS) device with multiple operating modes (e.g., frequency multiplication mode, etc.). The device includes an N-type field effect transistor (NFET) and a P-type field effect transistor (PFET), which are threshold voltage-programmable, which are connected in parallel, and which have electrically connected gates. The threshold voltages of the NFET and PFET can be concurrently programmed and the operating mode of the device can be set depending upon the specific combination of threshold voltages achieved in the NFET and PFET. Optionally, the threshold voltages of the NFET and PFET can be concurrently reprogrammed to switch the operating mode. Such a device is relatively small and achieves frequency multiplication and other functions with minimal power consumption. Also disclosed are methods for forming the device and for reconfiguring the device (i.e., for concurrently programming the NFET and PFET to set or switch operating modes).

19 Claims, 10 Drawing Sheets

(51) Int. Cl.
    *H01L 29/788*    (2006.01)
    *H01L 29/66*     (2006.01)
    *H01L 29/792*    (2006.01)

(52) U.S. Cl.
    CPC .... *H01L 29/66833* (2013.01); *H01L 29/7881* (2013.01); *H01L 29/78391* (2014.09); *H01L 29/792* (2013.01); *H01L 2027/11866* (2013.01)

(56) References Cited

U.S. PATENT DOCUMENTS

| | | | | |
|---|---|---|---|---|
| 8,576,628 | B2* | 11/2013 | Ueda | G11C 16/0441 |
| | | | | 365/185.24 |
| 2007/0164351 | A1* | 7/2007 | Hamamoto | H10B 12/00 |
| | | | | 257/324 |
| 2009/0114971 | A1* | 5/2009 | Cai | H01L 21/84 |
| | | | | 257/315 |
| 2009/0184346 | A1* | 7/2009 | Jain | H01L 29/122 |
| | | | | 257/314 |
| 2010/0246267 | A1* | 9/2010 | Hasler | G11C 16/0441 |
| | | | | 327/566 |
| 2012/0172823 | A1* | 7/2012 | Smith | A61F 5/443 |
| | | | | 604/339 |
| 2019/0172823 | A1* | 6/2019 | Chen | G06F 30/392 |

OTHER PUBLICATIONS

Shorubalko et al., "A Novel Frequency-Multiplication Device Based on Three-Terminal Ballistic Junction", IEEE Electron Device Letters, vol. 23, No. 7, 2002, pp. 377-379.

Wang et al., "Large Signal Operation of Small Band-Gap Carbon Nanotube-Based Ambipolar Transistor: A High-Performance Frequency Doubler", American Chemical Society, Nano Letters, vol. 10, 2010, pp. 3648-3655.

Yang et al., "Triple-Mode Single-Transistor Graphene Amplifier and Its Applications", ACS Nano, vol. 4, No. 10, 2010, pp. 5532-5538.

Van et al., "Ultralow-Power Non-Volatile Memory Cells Based on P(VDF-TrFE) Ferroelectric-Gate CMOS Silicon Nanowire Channel Field-Effect Transistors", Nanoscale, The Royal Society of Chemistry, 2015, pp. 1-8.

Rai et al., "Emerging Reconfigurable Nanotechnologies: Can They Support Future Electronics?", Association for Computing Machinery, 2018, pp. 1-8.

* cited by examiner

| Operating Mode | Input Node | P-FeFET Programming Node | N-FeFET Programming Node | Result |
|---|---|---|---|---|
| Frequency Multiplication Mode | 0V (GND) | +$x$V | -$x$V | Low Neg. Vt/Low Pos. Vt. See FIG. 4A |
| Positive Signal Transmission Mode | 0V (GND) | -$x$V | -$x$V | High Neg. Vt/Low Pos. Vt. See FIG. 4B |
| Signal Blocking Mode | 0V (GND) | -$x$V | +$x$V | High Neg. Vt/High Pos. Vt. See FIG. 4C |
| Negative Signal Transmission Mode | 0V (GND) | +$x$V | +$x$V | Low Neg. Vt/High Pos. Vt. See FIG. 4D |
| *Additional Modes (E.g., Alternative Transmission Mode) | 0V (GND) | +$y$V, where $|x|<|y|$ | -$y$V, where $|x|<|y|$ | Ultra Low Neg. Vt/Ultra Low Pos. Vt. See FIG. 4E |

FIG. 3

FREQUENCY MULTIPLICATION MODE

POSITIVE SIGNAL TRANSMISSION MODE

SIGNAL BLOCKING MODE

NEGATIVE SIGNAL TRANSMISSION MODE

ALTERNATIVE TRANSMISSION MODE

RECONFIGURABLE COMPLEMENTARY METAL OXIDE SEMICONDUCTOR DEVICE AND METHOD

BACKGROUND

Field of the Invention

The present invention relates to threshold voltage-programmable field effect transistors (e.g., ferroelectric field effect transistors (FeFETs), etc.) and, more particularly, to embodiments of a reconfigurable complementary metal oxide semiconductor (CMOS) device, a method of forming the device and of a method of reconfiguring (i.e., programming) the device.

Description of Related Art

Frequency multipliers are essential components of wireless communication systems where stable high-frequency oscillations are required. Current state-of-the-art frequency multipliers incorporate filtering and amplification circuits. Unfortunately, such filtering and amplification circuits consume significant amounts of chip area and power.

SUMMARY

Disclosed herein are embodiments of a reconfigurable complementary metal oxide semiconductor (CMOS) device. The device includes multiple field effect transistors (FETs) and, particularly, an N-type FET (NFET) and a P-type FET (PFET). The NFET and the PFET can both be threshold voltage-programmable FETs. Additionally, the NFET and the PFET can be electrically connected in parallel and can have electrically connected gates. With this configuration, the threshold voltages of the NFET and the PFET can be concurrently programmed through the application of a specific set of voltage conditions (as discussed in further in the detailed description section). As a result of the application of the specific set of voltage conditions, one specific combination of threshold voltages of multiple possible combinations of threshold voltages can be achieved in the two FETs such that the device is operable in one specific operating mode of multiple possible operating modes (e.g., a frequency multiplication operating mode, a positive signal transmission mode, a signal blocking mode, etc.). With this configuration, the threshold voltages of the NFET and the PFET can optionally be reprogrammed (e.g., in the field) through the application of a different set of voltage conditions to achieve a different specific combination of threshold voltages in the two FETs and, thus, switch the device to a different one of the multiple possible operating modes.

Also disclosed herein are embodiments of a method of forming a reconfigurable complementary metal oxide semiconductor (CMOS) device, as described above. The method can include providing a substrate and forming, on the substrate, the reconfigurable complementary metal oxide semiconductor (CMOS) device. Specifically, the method can include forming, on the substrate, a complementary pair of field effect transistors (FETs) and, particularly, an N-type FET (NFET) and a P-type FET (PFET). The NFET and PFET can be formed such that they are threshold voltage-programmable FETs. Additionally, the NFET and the PFET can be formed so that they are electrically connected in parallel and so that they have electrically connected gates.

Also disclosed herein are embodiments of a method for reconfiguring (also referred to herein as programming) a reconfigurable complementary metal oxide semiconductor (CMOS) device, as described above. Specifically, the method can include providing such a reconfigurable CMOS device. The method can further include concurrently programming the threshold voltages of the NFET and the PFET. Specifically, the threshold voltages of the NFET and the PFET can be concurrently programmed through the application of a specific set of voltage conditions (as discussed in further in the detailed description section). As a result of the application of the specific set of voltage conditions, one specific combination of threshold voltages of multiple possible combinations of threshold voltages can be achieved in the two FETs such that the device is operable in one specific operating mode of multiple possible operating modes (e.g., a frequency multiplication operating mode, a positive signal transmission mode, a signal blocking mode, etc.). Optionally, the method can also include concurrently reprogramming the threshold voltages of the NFET and the PFET (e.g., in the field) through the application of a different set of voltage conditions to achieve a different specific combination of threshold voltages in the two FETs and, thus, switch the device to a different one of the multiple possible operating modes.

BRIEF DESCRIPTION OF THE SEVERAL VIEWS OF THE DRAWINGS

The present invention will be better understood from the following detailed description with reference to the drawings, which are not necessarily drawn to scale and in which:

FIG. 3 is a table illustrating exemplary sets of voltage conditions that can be employed to reconfigure an embodiment of the reconfigurable CMOS device that includes N-type and P-type FeFETs;

FIG. 4A-1 is a graph illustrating a negative and positive threshold voltage curves for a first device state and FIG. 4A-2 is a graph including a drain current-to-gate voltage curve, an input voltage signal, and an output current signal for the frequency multiplication mode listed in the table of FIG. 3 and associated with the first device state;

FIG. 4B-1 is a graph illustrating a negative and positive threshold voltage curves for a second device state and FIG. 4B-2 is a graph including a drain current-to-gate voltage curve, an input voltage signal, and an output current signal for the positive signal transmission mode listed in the table of FIG. 3 and associated with the second device state;

FIG. 4C-1 is a graph illustrating a negative and positive threshold voltage curves for a third device state and FIG. 4C-2 is a graph including a drain current-to-gate voltage curve, an input voltage signal, and an output current signal for the signal blocking mode listed in the table of FIG. 3 and associated with the third device state;

FIG. 4D-1 is a graph illustrating a negative and positive threshold voltage curves for a fourth device state and FIG. 4D-2 is a graph including a drain current-to-gate voltage curve, an input voltage signal, and an output current signal for the negative signal transmission mode listed in the table of FIG. 3 and associated with the fourth device state;

FIG. 4E-1 is a graph illustrating a negative and positive threshold voltage curves for a fifth device state and FIG. 4E-2 is a graph including a drain current-to-gate voltage curve, an input voltage signal, and an output current signal for the alternative transmission mode listed in the table of FIG. 3 and associated with the fifth device state;

DETAILED DESCRIPTION

As mentioned above, frequency multipliers are essential components of wireless communication systems where stable high-frequency oscillations are required. Current state-of-the-art frequency multipliers incorporate filtering and amplification circuits. Unfortunately, such filtering and amplification circuits consume significant amounts of chip area and power.

In view of the foregoing, disclosed herein are embodiments of a reconfigurable complementary metal oxide semiconductor (CMOS) device with multiple different operating modes including, but not limited to, a frequency multiplication mode. The device can include an N-type field effect transistor (NFET) and a P-type field effect transistor (PFET), which are threshold voltage-programmable, which are connected in parallel, and which have electrically connected gates. With this configuration, the threshold voltages of the NFET and PFET can be concurrently programmed and the operating mode of the device can be set depending upon the specific combination of threshold voltages achieved in the NFET and PFET during programming. For example, if the NFET has a low positive threshold voltage and the PFET has a low negative threshold voltage, the device can operate in a frequency multiplication mode. Additionally, the threshold voltages of the NFET and PFET could be concurrently reprogrammed (e.g., in the field), as needed, to switch the operating mode of the device. Such a device can be relatively small (i.e., can consume a minimal amount of chip area) and can achieve frequency multiplication and other functions with minimal power consumption. Also disclosed herein are embodiments of a method for forming the device and embodiments of a method for reconfiguring the device (i.e., for concurrently programming the NFET and PFET to set or switch operating modes).

Figure 1:
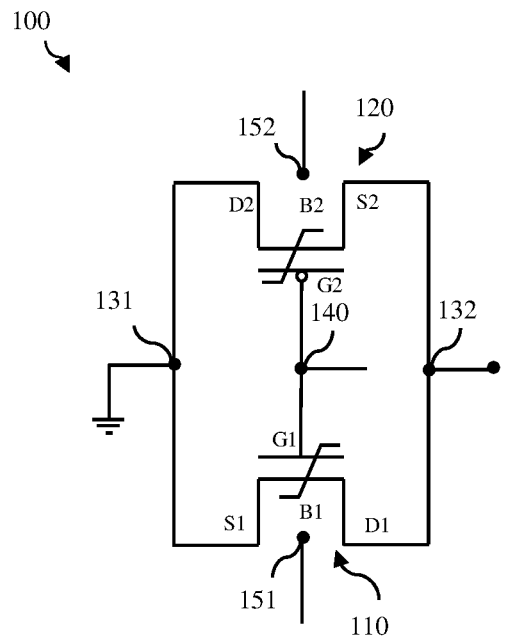
FIG. 1 is a schematic diagram illustrating disclosed embodiments of a reconfigurable complementary metal oxide semiconductor (CMOS) device.
Figure 2A:
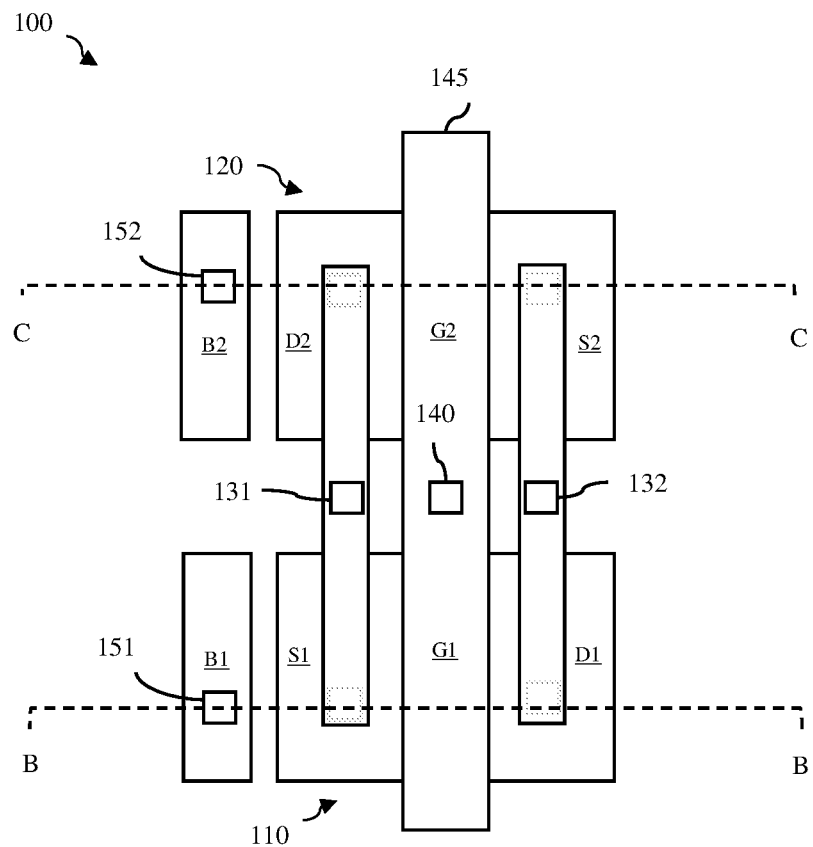
FIG. 2A is exemplary layout diagram for an embodiment of the reconfigurable CMOS device and FIGS. 2B and 2C are cross-section diagrams of exemplary threshold voltage-programmable FETs (e.g., N-type and P-type ferroelectric field effect transistors (FeFETs)) that can be incorporated into this embodiment of the reconfigurable CMOS device.
Figure 2B:
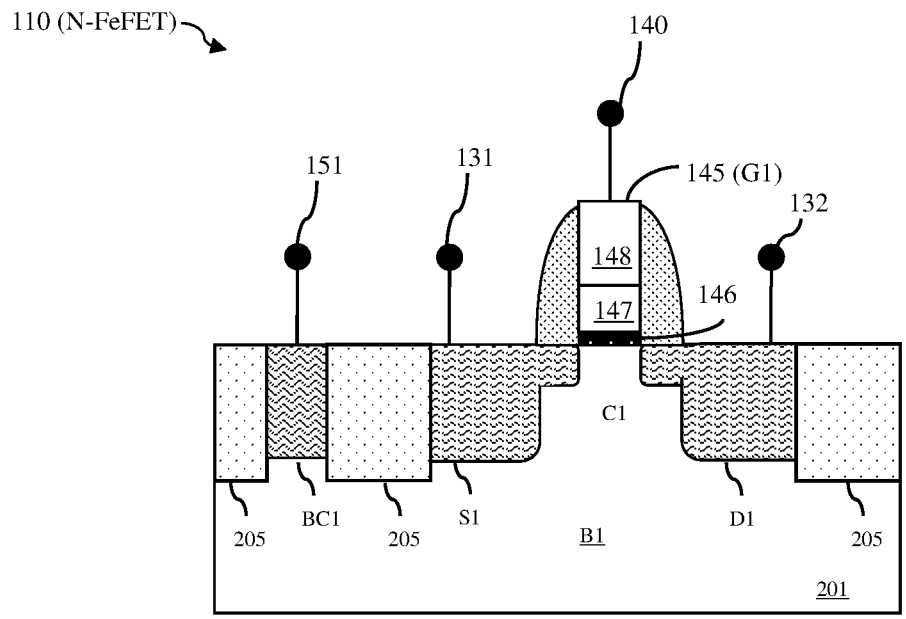
Figure 2C:
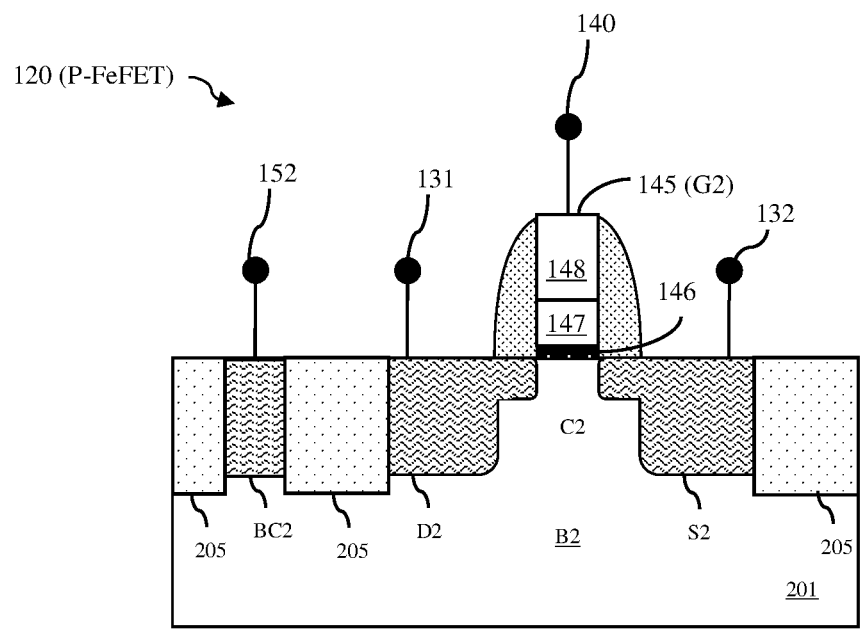

FIG. 1 is a schematic diagram illustrating embodiments of a reconfigurable complementary metal oxide semiconductor (CMOS) device 100. FIGS. 2A-2C are a top view layout and two cross-section diagrams illustrating an exemplary embodiment of the device 100 (as discussed in greater detail below).

Referring to FIGS. 1 and 2A-2C in combination, the reconfigurable CMOS device 100 can include a pair of complementary field effect transistors (FETs) and, particularly, an N-type FET 110 (NFET) and a P-type FET 120 (PFET). The NFET 110 and the PFET 120 can be electrically connected in parallel and can have electrically connected gates.

For purposes of illustration, the NFET 110 and the PFET 120 of the device 100 are described below and illustrated in the drawings as being planar FETs on a bulk semiconductor substrate 201 (e.g., a bulk silicon substrate). However, it should be understood that the drawings are not intended to be limiting. Alternatively, the NFET and the PFET could be non-planar FETs and/or on semiconductor-on-insulator (e.g., silicon-on-insulator (SOI)) substrate.

Each of the disclosed embodiments of the device 100 can include an NFET 110. The NFET 110 can have a first body region (B1) (e.g., a P– body region) (e.g., defined by shallow trench isolation (STI) regions 205) and, in the first body region (B1), a first channel region (C1) (e.g., a P– channel region) positioned laterally between a first source region (S1) (e.g., an N+ source region) and a first drain region (D1) (e.g., an N+ drain region). Optionally, the NFET 110 can also have, in the first body region (B1), a first body contact region (BC1) (e.g., a P+ region) electrically isolated from the first source region (S1) and the first drain region (D1) (e.g., by an STI region 205). The first body contact region (BC1) can facilitate contacting the first body region (B1) during device programming, as discussed in greater detail below. The NFET 110 can further have a first gate (G1) adjacent to the first channel region (C1).

Each of the disclosed embodiments of the device 100 can also include a PFET 120. The PFET 120 can have a second body region (B2) (e.g., an N– body region) (e.g., defined by STI regions 205) and, in the second body region (B2), a second channel region (C2) (e.g., an N– channel region) positioned laterally between a second source region (S2) (e.g., a P+ source region) and a second drain region (D2) (e.g., a P+ drain region). Optionally, the PFET 120 can also have, in the second body region (B2), a second body contact region (BC2) (e.g., an N+ region) electrically isolated from the second source region (S2) and the second drain region (D2) (e.g., by an STI region 205). The second body contact region (BC2) can facilitate contacting the second body region (B2) during device programming, as discussed in greater detail below. The PFET 120 can further have a second gate (G2) adjacent to the second channel region (C2).

The NFET 110 and the PFET 120 can be electrically connected in parallel. That is, the first drain region (D1) of the NFET 110 can be electrically connected (e.g., by a local interconnect or by a combination of contacts and back-end-of-the-line wiring) to the second source region (S2) of the PFET 120. Furthermore, the first source region (S1) of the NFET 110 can be electrically connected (e.g., by a local interconnect or by a combination of contacts and back-end-of-the-line wiring) to the second drain region (D2) of the PFET 120. Additionally, the gates of the NFET 110 and the PFET 120 (i.e., the first gate (G1) and the second gate (G2)) can also be electrically connected.

The NFET 110 and the PFET 120 can specifically be threshold voltage-programmable FETs. That is, the NFET 110 can be a threshold voltage-programmable NFET and the PFET 120 can be a threshold voltage-programmable PFET. Those skilled in the art will recognize that a threshold voltage-programmable FET refers to a FET where the threshold voltage of the FET can be programmed (i.e., selectively changed, adjusted, etc.) in response to the application of a particular set of voltage conditions to the gate of the FET and to the source/drain regions and/or to the body region of the FET. That is, different sets of voltage conditions applied to the gate and to the source/drain regions and/or to the body region can cause the FET to exhibit different threshold voltages, respectively. Each threshold voltage-programmable NFET will specifically have two or more different programmable positive threshold voltages and a threshold voltage-programmable PFET will have two or more different programmable negative threshold voltages. Exemplary voltage-programmable FETs that could be incorporated into the device 100 include, but are not limited to, ferroelectric field effect transistors (FeFETs), floating gate field effect transistors (FGFETs), and charge-trap field effect transistors (CTFETs). Those skilled in the art will also recognize that the number of different programmable threshold voltages can vary depending upon the type of threshold voltage-programmable FET (e.g., FeFET, FGFET, CTFET, etc.). Those skilled in the art will also recognize that the different sets of voltage conditions applied to the gate and to the source/drain regions and/or to the body region of a threshold voltage-programmable FET for programming purposes will vary depending upon the type of threshold voltage-programmable FET (e.g., FeFET, FGFET, CTFET, etc.) and also on the conductivity type of that FET (e.g., N-type or P-type) (as discussed in greater detail below with regard to the method embodiments for reconfiguring the device 100).

For purposes of illustration, the device 100 is described in greater detail below and illustrated in FIGS. 2A-2C as including an N-type FeFET 110 and a P-type FeFET 120. That is, FIG. 2A is a top view diagram illustrating an exemplary layout that could be employed for such a device 100 and FIGS. 2B and 2C are cross-section diagrams of an N-type FeFET 110 and a P-type FeFET 120, respectively, which are connected in parallel and which have electrically connected gates as indicated in the layout of FIG. 2A.

It should be understood that the configuration of the first and second gates (G1/G2) of the NFET 110 and the PFET 120, respectively, will depend upon what type of threshold voltage-programmable FETs they are. For example, in the exemplary embodiment shown in FIGS. 2A-2C where the NFET 110 and the PFET 120 are both FeFETs, each gate structure G1, G2 can be a multi-layered gate structure including at least: a ferroelectric layer 147 (e.g., a hafnium oxide layer or some other suitable ferroelectric layer) adjacent to the channel region; and a metal gate layer 148 on the ferroelectric layer 147. Optionally, each gate structure G1, G2 can include a relatively thin gate insulator layer 146 (e.g., a silicon dioxide layer or other suitable insulator layer) stacked between the channel region and the ferroelectric layer 147 (as shown). Optionally, each gate structure G1, G2 can also include an additional metal gate layer so that the ferroelectric layer 147 is sandwiched between two metal gate layers (not shown).

In alternative embodiments (not shown) where the NFET 110 and PFET 120 are different types of threshold voltage-programmable FETs (e.g., FGFETs or CTFETs), the gate structures will be different. For example, the gate structure of a FGFET could be a multi-layered gate structure including: a gate dielectric layer adjacent to the channel region; a floating gate layer (e.g., a polysilicon layer) adjacent to the gate dielectric layer; and a control gate layer (e.g., a metal gate layer) adjacent to the floating gate layer. The gate structure of a CTFET could be a multi-layered gate structure including: a gate dielectric layer adjacent to the channel region; a charge trap layer (e.g., a silicon nitride layer) adjacent to the gate dielectric layer; and a control gate layer (e.g., a metal gate layer) adjacent to the charge trap layer.

In any case, within the device 100, the NFET 110 and the PFET 120 can have discrete first and second gates G1 and G2, respectively, which are electrically connected (e.g., by a local interconnect or by a combination of contacts and back-end-of-the-line wiring). Alternatively, as illustrated in FIGS. 2A-2C, the device 100 can include a single gate structure 145 (referred to herein as a shared gate structure for both the NFET and the PFET). This single gate structure 145 (including each of the gate layers mentioned above) can traverse the first channel region (C1) of the NFET 110 and the second channel region (C2) of the PFET 120 such that the first gate (G1) of the NFET 110 and the second gate (G2) of the PFET 120 are simply different portions of the same gate structure.

Referring to FIG. 1 and FIGS. 2A-2C in combination, each of the disclosed embodiments of the device 100 can further include an input node 140, an output node 132, a ground node 131, a first programming node 151 (also referred to herein as the NFET programming node), and a second programming node 152 (also referred to herein as the PFET programming node). The input node 140 can be at a junction between the first gate (G1) and the second gate (G2), which are electrically connected (e.g., on the single gate structure 145, if applicable). The output node 132 can be at a junction between the first drain region (D1) of the NFET 110 and the second source region (S2) of the PFET 120. The ground node (i.e., a connection to ground) can be at a junction between the first source region (S1) of the NFET 110 and the second drain region (D2) of the PFET 120. The NFET programming node 151 can be at the first body (B1) (e.g., via BC1) of the NFET 110 and the PFET programming node 152 can be at the second body (B2) (e.g., via BC2) of the PFET.

In a device 100, as described above, the threshold voltages of the NFET 110 and the PFET 120 can be concurrently programmed through the application of a specific set of voltage conditions to the input node 140 (i.e., to gates (G1) and (G2) of both the NFET 110 and the PFET 120), to the NFET programming node 151 (i.e., to the first body (B1) of the NFET 110), and to the PFET programming node 152 (i.e., to the second body (B2) of the PFET 120). As a result of the application of the specific set of voltage conditions, the device 100 will be programmed (e.g., configured, set, etc.) to operate in one of multiple different operating modes. That is, as a result of the application of the specific set of voltage conditions, the NFET 110 and the PFET 120 will be programmed so that, together, they have a specific combination of threshold voltages of multiple possible combinations of threshold voltages. Depending upon this specific combination of threshold voltages, the device 100 will operate in a specific operating mode of multiple possible operating modes (e.g., a frequency multiplication operating mode, a positive signal transmission mode, a signal blocking mode, a negative signal transmission mode, etc.). With this configuration, the threshold voltages of the NFET 110 and the PFET 120 can also optionally be reprogrammed (e.g., in the field) through the application of a different set of voltage conditions to achieve a different specific combination of threshold voltages in the two FETs and, thus, switch the device to a different one of the multiple possible operating modes. In any case, when the device 100 operates in a specific one of the multiple different operating modes, the device 100 exhibits a specific one of multiple different drain current-to-gate voltage curves. That is, in each different operating mode, the device exhibits a different drain current-to-gate voltage curve. Thus, the device 100 is reconfigurable for different functions.

For example, the NFET 110 could be programmable so as to have either a low positive threshold voltage (low pos. Vt) or a high positive threshold voltage (high pos. Vt), which is higher than the low positive threshold voltage. The PFET 120 could be programmable so as to have either a low negative threshold voltage (low neg. Vt) or a high negative threshold voltage (high neg. Vt), which his higher than the low negative threshold voltage. It should be understood that one negative threshold voltage is higher than another negative threshold voltage when the absolute value of the voltage amount is higher and one negative threshold voltage is lower than another negative threshold voltage when the absolute value of the voltage amount is lower. If the NFET 110 and the PFET 120 each have two programmable threshold voltages (as discussed above), concurrent programming of the threshold voltages of these two FETs can be employed to reconfigure the device 100 so that it is in a selected one of four different states and, thus, so that it operates in a selected one of four different operating modes. These four different device states can include: a first state with the NFET 110 having the low positive threshold voltage and the PFET 120 having the low negative threshold voltage (e.g., for the frequency multiplication mode); a second state with the NFET 110 having the low positive threshold voltage and the PFET 120 having the high negative threshold voltage (e.g., for the positive signal transmission mode); a third state with NFET 110 having the high positive threshold voltage and PFET 120 having the high negative threshold voltage (e.g., for the signal blocking mode); and a fourth state with the NFET 110 having the high positive threshold voltage and the PFET 120 having the low negative threshold voltage (e.g., for the negative signal transmission mode).

It should be understood that if the NFET 110 and PFET 120 have more than two programmable threshold voltages, the device 100 can be reconfigured into any of more than four different states for more than four different operating modes. For example, the NFET 110 could also have an ultra-low positive threshold voltage and the PFET 120 could have an ultra-low negative threshold voltage. In this case, additional states for the device 100 can include: a fifth state with the NFET 110 having the ultra-low positive threshold voltage and PFET 120 having the ultra-low negative threshold voltage (e.g., for an alternative signal transmission mode); a sixth state with the NFET 110 having the ultra-low positive threshold voltage and the PFET 120 having a low negative threshold voltage; and so on.

FIG. 3 is a table illustrating exemplary sets of voltage conditions that could be employed to reconfigure a device 100 that includes an N-type FeFET 110 and a P-type FeFET 120, which are electrically connected in parallel and which have electrically connected gates. Specifically, this table illustrates exemplary voltage conditions that can be applied to the input node 140 (i.e., to the gates (G1/G2), to the NFET programming node 151 (i.e., to the first body (B1) of the N-type FeFET 110), and to the PFET programming node 152 (i.e., to the second body (B2) of the P-type FeFET 120) in order to achieve the above-mentioned devices states and operating modes.

Figures 1, 4A:
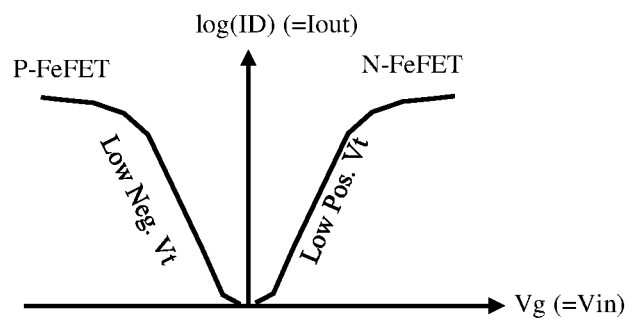
Figures 2, 4A:
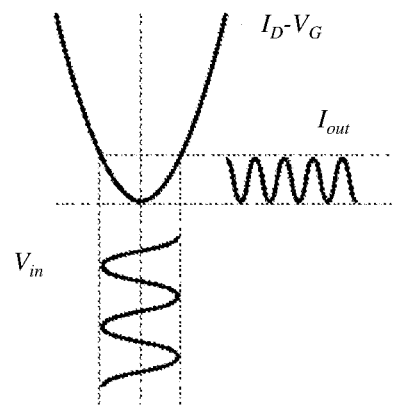

For example, to reconfigure the device 100 so that it is in the first device state for frequency multiplication mode, the input node 140 can be discharged to ground, a specific negative voltage (e.g., −4V) can be applied to the NFET programming node 151, and a corresponding positive voltage (e.g., +4V) can be applied to the PFET programming node 152. As a result, the direction of polarization vector in the ferroelectric layer of the first gate (G1) will force electrons into the first channel region (C1) ensuring that the N-type FeFET 110 has a low positive threshold voltage. Additionally, the direction of polarization vector in the ferroelectric layer of the second gate (G2) will force holes into the second channel region (C2) ensuring that the P-type FeFET 120 has a low negative threshold voltage. FIG. 4A-1 is a graph illustrating a negative and positive threshold voltage curves for the first device state and FIG. 4A-2 is a graph including a drain current-to-gate voltage curve, an input voltage signal, and an output current signal for the frequency multiplication mode listed in the table of FIG. 3 and associated with the third device state. As illustrated in FIG. 4A-2, this first device state enables two times frequency multiplication for the parabolic part of the drain current-to-gate voltage curve. This example specifically illustrates how the disclosed device 100 achieves frequency multiplication without requiring significant chip space or power. Thus, such a device 100 may be an optimal solution for use in wireless communication systems where stable high-frequency oscillations are required.

Figures 1, 4B:
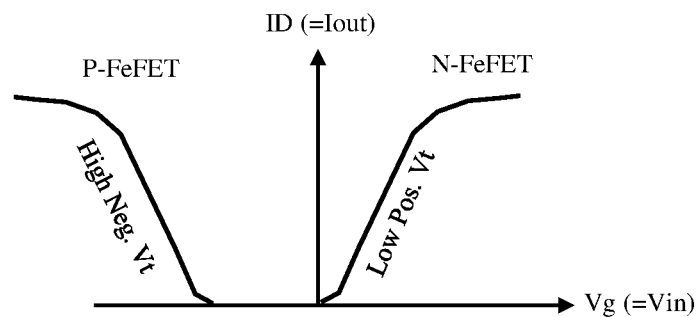
Figures 2, 4B:
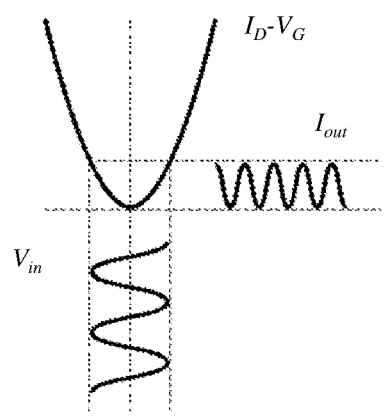

To reconfigure the device 100 so that it is in the second device state for the positive signal transmission mode, the input node 140 can be discharged to ground, a specific negative voltage (e.g., −4V) can be applied to the NFET programming node 151, and the same negative voltage (e.g., −4V) can be applied to the PFET programming node 152. As a result, the direction of polarization vector in the ferroelectric layer of the first gate (G1) will force electrons into the first channel region (C1) ensuring that the N-type FeFET 110 has a low positive threshold voltage. However, the direction of polarization vector in the ferroelectric layer of the second gate (G2) will force holes out of the second channel region (C2) ensuring that the P-type FeFET 120 has a high negative threshold voltage. FIG. 4B-1 is a graph illustrating a negative and positive threshold voltage curves for the second device state and FIG. 4B-2 is a graph including a drain current-to-gate voltage curve, an input voltage signal, and an output current signal for the positive signal transmission mode listed in the table of FIG. 3 and associated with the third device state. As illustrated, this second device state facilitates blocking of the negative signal part and transmission of the positive signal part only.

Figures 1, 4C:
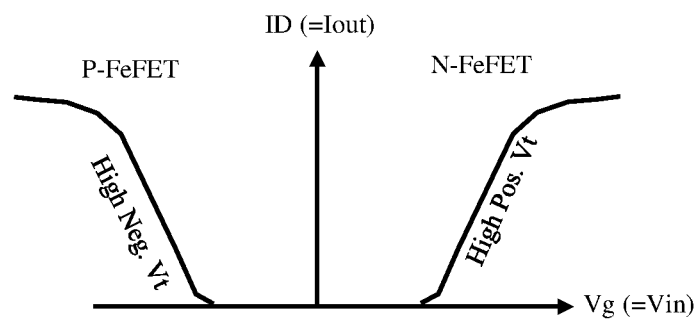
Figures 2, 4C:
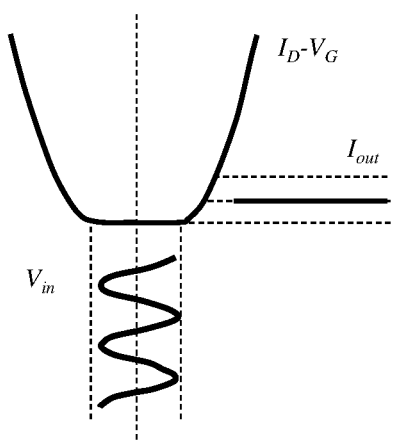

To reconfigure the device 100 so that it is in the third device state for the signal blocking mode, the input node 140 can be discharged to ground, a specific positive voltage (e.g., +4V) can be applied to the NFET programming node 151, and a corresponding negative voltage (e.g., −4V) can be applied to the PFET programming node 152. As a result, the direction of polarization vector in the ferroelectric layer of the first gate (G1) will force electrons out of the first channel region (C1) ensuring that the N-type FeFET 110 has a high positive threshold voltage. The direction of polarization vector in the ferroelectric layer of the second gate (G2) will force holes out of the second channel region (C2) ensuring that the P-type FeFET 120 has a high negative threshold voltage. FIG. 4C-1 is a graph illustrating a negative and positive threshold voltage curves for the third device state and FIG. 4C-2 is a graph including a drain current-to-gate voltage curve, an input voltage signal, and an output current signal for the signal blocking mode listed in the table of FIG. 3 and associated with the third device state. As illustrated, this third device state facilitates blocking of both the positive and negative signal parts.

Figures 1, 4D:
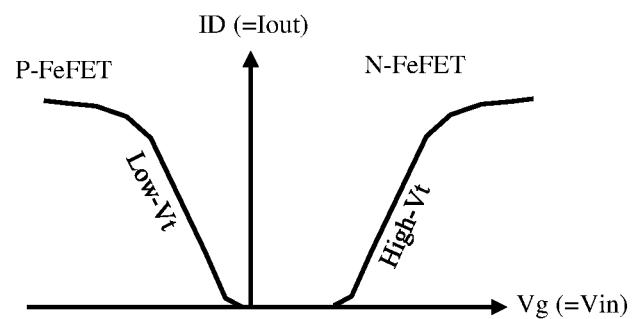
Figures 2, 4D:
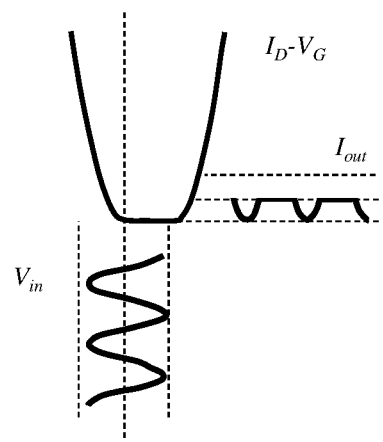

To reconfigure the device 100 so that it is in the fourth device state for the negative signal transmission mode, the input node 140 can be discharged to ground, a specific positive voltage (e.g., +4V) can be applied to the NFET programming node 151, and the same positive voltage (e.g., +4V) can be applied to the PFET programming node 152. As a result, the direction of polarization vector in the ferroelectric layer of the first gate (G1) will force electrons out of the first channel region (C1) ensuring that the N-type FeFET 110 has a high positive threshold voltage. However, the direction of polarization vector in the ferroelectric layer of the second gate (G2) will force holes into the second channel region (C2) ensuring that the P-type FeFET 120 has a low negative threshold voltage. FIG. 4D-1 is a graph illustrating a negative and positive threshold voltage curves for the fourth device state and FIG. 4D-2 is a graph including a drain current-to-gate voltage curve, an input voltage signal, and an output current signal for the negative signal transmission mode listed in the table of FIG. 3 and associated with the fourth device state. As illustrated, this fourth device state facilitates blocking of the positive signal part and transmission of the negative signal part only.

Figures 1, 4E:
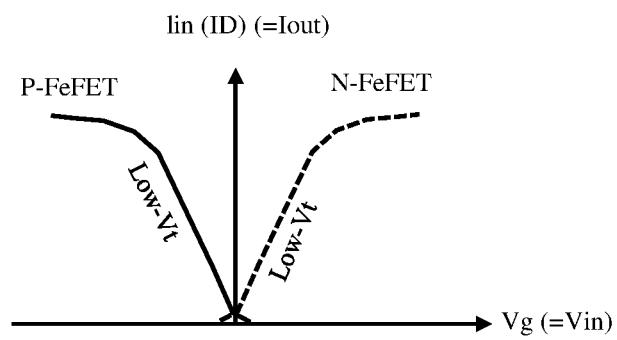
Figures 2, 4E:
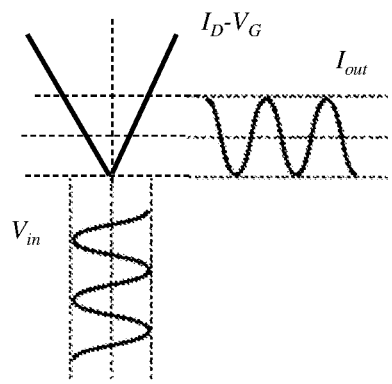

As mentioned above, the N-type FeFET 110 and the P-type FeFET 120 could have more than two possible programmable threshold voltages. For example, an N-type FeFET could also have an ultra-low positive threshold voltage and a P-type FeFET also have an ultra-low negative threshold voltage. In this case, to reconfigure the device 100 so that it is in a fifth device state for an alternative transmission mode, the input node 140 can be discharged to ground, a specific high negative voltage (i.e., a higher negative voltage than the negative voltage used for the first state, e.g., −5V) can be applied to the NFET programming node 151, and a corresponding high positive voltage (e.g., +5V) can be applied to the PFET programming node 152. As a result, the direction of polarization vector in the ferroelectric layer of the first gate (G1) will force electrons into the first channel region (C1) ensuring that the N-type FeFET 110 has an ultra-low positive threshold voltage. Additionally, the direction of polarization vector in the ferroelectric layer of the second gate (G2) will force holes into the second channel region (C2) ensuring that the P-type FeFET 120 has an ultra-low negative threshold voltage. FIG. 4E-1 is a graph illustrating a negative and positive threshold voltage curves for the fifth device state and FIG. 4E-2 is a graph including a drain current-to-gate voltage curve, an input voltage signal, and an output current signal for the alternative transmission mode listed in the table of FIG. 3 and associated with the fifth device state. As illustrated, this fifth state enables signal transmission along the linear part of the drain current-to-gate voltage curve. This example specifically illustrates that different parts of the drain current-to-gate voltage curve can be accessed by different programming/erase voltages.

It should be understood that for embodiments where the device 100 includes different types of threshold voltage-programmable FETs (e.g., FGFETs or CTFETs as opposed to FeFETs), different sets of voltage conditions would be employed to concurrently program the NFET 110 and PFET 120 and thereby reconfigure the device 100. This is because the mechanism by which threshold voltage programming is achieved in FGFETs and CTFETs is different from the mechanism by which threshold voltage programming is achieve in FeFETs.

Figure 5:
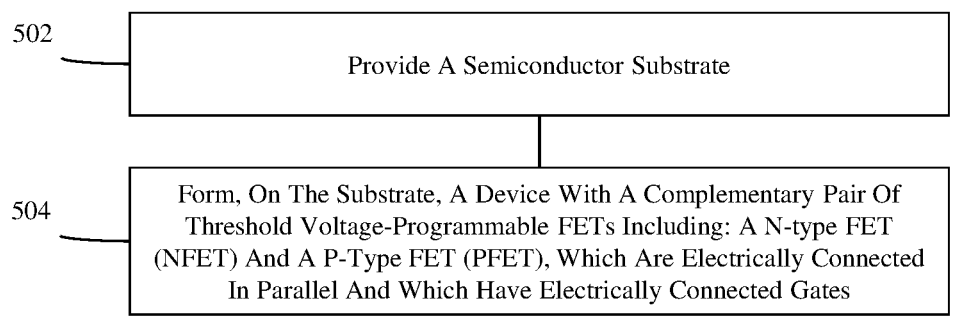
FIG. 5 is a flow diagram illustrating method embodiments for forming the reconfigurable CMOS device.

Referring to the flow diagram of FIG. 5, also disclosed herein are embodiments of a method of forming a reconfigurable complementary metal oxide semiconductor (CMOS) device. The method can include providing a semiconductor substrate (see process step 502). The semiconductor substrate can be a bulk semiconductor substrate (e.g., a bulk silicon substrate). Alternatively, the semiconductor substrate can be a semiconductor-on-insulator (e.g., a silicon-on-insulator (SOI) substrate).

The method can further include forming, on the semiconductor substrate, a reconfigurable complementary metal oxide semiconductor (CMOS) device (see process step 504). Specifically, the reconfigurable CMOS device 100 can be formed at process step 504 using conventional CMOS processing techniques, except that the specific front-end-of-the-line (FEOL), middle-of-the-line (MOL), and back-end-of-the-line (BEOL) CMOS processing steps used at process step 504 should be performed so as to form the novel reconfigurable CMOS device 100 shown, for example, in FIGS. 1 and 2A-2C and including a complementary pair of field effect transistors (FETs) (i.e., the N-type FET 110 (NFET) and a P-type FET 120 (PFET)), which are threshold voltage-programmable FETs, which are electrically connected in parallel, and which have electrically connected gates.

More specifically, an NFET 110 can be formed so as to have a first body region (B1) (e.g., a P− body region) (e.g., defined by shallow trench isolation (STI) regions 205) and, in the first body region (B1), a first channel region (C1) (e.g., a P− channel region) positioned laterally between a first source region (S1) (e.g., an N+ source region) and a first drain region (D1) (e.g., an N+ drain region). Optionally, the NFET 110 can be formed so as to also have, in the first body region (B1), a first body contact region (BC1) (e.g., a P+ region) electrically isolated from the first source region (S1) and the first drain region (D1) (e.g., by an STI region 205). The first body contact region (BC1) can facilitate contacting the first body region (B1) during device programming, as discussed in greater detail below. A first gate (G1) can be formed adjacent to the first channel region (C1). Concurrently, the PFET 120 can be formed so as to have a second body region (B2) (e.g., an N− body region) and, in the second body region (B2), a second channel region (C2) (e.g., an N− channel region) positioned laterally between a second source region (S2) (e.g., a P+ source region) and a second drain region (D2) (e.g., a P+ drain region). Optionally, the PFET 120 can also be formed also have, in the second body region (B2), a second body contact region (BC2) (e.g., an N+ region) electrically isolated from the second source region (S2) and the second drain region (D2) (e.g., by an STI region 205). The second body contact region (BC2) can facilitate contacting the second body region (B2) during device programming, as discussed in greater detail below. A second gate (G2) can be formed adjacent to the second channel region (C2).

The NFET 110 and the PFET 120 can be formed as planar FETs, as illustrated. Alternatively, the NFET 110 and the PFET 120 could be formed as non-planar FETs (not shown).

The NFET 110 and the PFET 120 can further be formed so that they are threshold voltage-programmable FETs. Those skilled in the art will recognize that the configuration of the first and second gates (G1/G2) of the NFET 110 and the PFET 120, respectively, will depend upon what type of threshold voltage-programmable FETs being formed. For example, the gate structure of a FeFET can be formed so as to include at least: a ferroelectric layer 147 (e.g., a hafnium oxide layer or some other suitable ferroelectric layer) adjacent to the channel region; and a metal gate layer 148 on the ferroelectric layer 147 (e.g., as shown in FIGS. 2B and 2C). Optionally, the gate structure of a FeFET can be formed so as to also include a relatively thin gate insulator layer 146 (e.g., a silicon dioxide layer or other suitable insulator layer) stacked between the channel region and the ferroelectric layer 147 (as shown) and/or an additional metal gate layer so that the ferroelectric layer 147 is sandwiched between two metal gate layers (not shown). In alternative embodiments (not shown) where different types of threshold voltage-programmable FETs (e.g., FGFETs or CTFETs) are being formed, the gate structures will be different. For example, the gate structure of a FGFET can be formed so as to include: a gate dielectric layer adjacent to the channel region; a floating gate layer (e.g., a polysilicon layer) adjacent to the gate dielectric layer; and a control gate layer (e.g., a metal gate layer) adjacent to the floating gate layer. The gate structure of a CTFET can be formed so as to include: a gate dielectric layer adjacent to the channel region; a charge trap layer (e.g., a silicon nitride layer) adjacent to the gate dielectric layer; and a control gate layer (e.g., a metal gate layer) adjacent to the charge trap layer.

It should be noted that the first and second gates G1 and G2 can be formed as discrete gates and subsequently electrically connected (e.g., by a local interconnect or by a combination of contacts and back-end-of-the-line wiring). Alternatively, as illustrated in FIGS. 2A-2C, a single gate structure across the first channel region (C1) of the NFET 110 and the second channel region (C2) of the PFET 120 and, thus, such that the first gate (G1) of the NFET 110 and the second gate (G2) of the PFET 120 are simply different portions of the same gate structure.

Finally, local interconnects and/or a combination of contacts and back-end-of-the-line wiring can be formed so as to electrically connect the NFET 110 and the PFET 120 in parallel and, if necessary, to electrically connect the gates. That is, the first drain region (D1) of the NFET 110 can be electrically connected (e.g., by a local interconnect or by a combination of contacts and back-end-of-the-line wiring) to the second source region (S2) of the PFET 120. Furthermore, the first source region (S1) of the NFET 110 can be electrically connected (e.g., by a local interconnect or by a combination of contacts and back-end-of-the-line wiring) to the second drain region (D2) of the PFET 120. Additional contacts and back-end-of-the-line wiring can be formed to facilitate access to the following nodes: an input node 140 at a junction between the first gate (G1) and the second gate (G2); an output node 132 at a junction between the first drain region (D1) of the NFET 110 and the second source region (S2) of the PFET 120; a ground node (i.e., a connection to ground) at a junction between the first source region (S1) of the NFET 110 and the second drain region (D2) of the PFET 120; an NFET programming node 151 at the first body (B1) of the NFET 110; and a PFET programming node 152 at the second body (B2) of the PFET 120.

Figure 6:
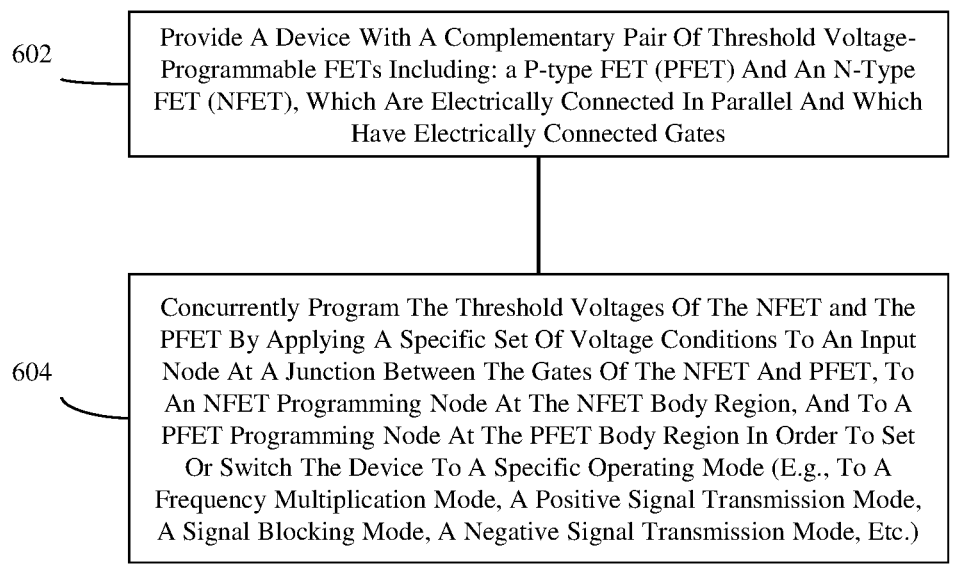
FIG. 6 is a flow diagram illustrating method embodiments for reconfiguring the reconfigurable CMOS device.

Referring to the flow diagram of FIG. 6, also disclosed herein are embodiments of a method for reconfiguring (also referred to herein as programming) a reconfigurable complementary metal oxide semiconductor (CMOS) device 100, as described in detail above. The method can include providing the reconfigurable CMOS device 100 (see process step 602). This reconfigurable CMOS device 100 can, for example, be on an integrated circuit (IC) chip for a wireless communication system or on some other IC chip. The method can further include concurrently programming the threshold voltages of the NFET 110 and the PFET 120 of the device 100 in order to reconfigure the device 100 and, more particularly, to initial set or subsequently switch the device to a specific one of multiple possible operating modes (see process step 604).

More specifically, as mentioned above and illustrated in FIGS. 1 and 2A-2C, the device 100 can include an input node 140 at a junction between the first gate (G1) and the second gate (G2), which are electrically connected (e.g., on the single gate structure 145, if applicable). The device 100 can also include an NFET programming node 151 at the first body (B1) of the NFET 110 and a PFET programming node 152 at the second body (B2) of the PFET. At process step 604, the threshold voltages of the NFET 110 and the PFET 120 can be concurrently programmed through the application of a specific set of voltage conditions to the input node 140 (i.e., to gates (G1) and (G2) of both the NFET 110 and the PFET 120), to the NFET programming node 151 (i.e., to the first body (B1) of the NFET 110), and to the PFET programming node 152 (i.e., to the second body (B2) of the PFET 120). As a result of the application of the specific set of voltage conditions, the device 100 will be programmed (e.g., reconfigured, set, etc.) to operate in a selected one of multiple different operating modes. That is, as a result of the application of the specific set of voltage conditions, the NFET 110 and the PFET 120 will be programmed so that, together, they have a specific combination of threshold voltages of multiple possible combinations of threshold voltages. Depending upon this specific combination of threshold voltages in the FETs 110 and 120, the device 100 will operate in a specific operating mode of multiple possible operating modes (e.g., a frequency multiplication operating mode, a positive signal transmission mode, a signal blocking mode, a negative signal transmission mode, etc.).

For example, the NFET 110 could be programmable so as to have either a low positive threshold voltage (low pos. Vt) or a high positive threshold voltage (high pos. Vt). The PFET 120 could be programmable so as to have either a low negative threshold voltage (low neg. Vt) or a high negative threshold voltage (high neg. Vt). In this case, the device 100 can be reconfigured at process step 604 so that it has a selected one of four different device states and, thus, so that it operates in a selected one of four different operating modes. These four different device states can include: a first state with the NFET 110 having the low positive threshold voltage and the PFET 120 having the low negative threshold voltage (e.g., for the frequency multiplication mode); a second state with the NFET 110 having the low positive threshold voltage and the PFET 120 having the high negative threshold voltage (e.g., for the positive signal transmission mode); a third state with NFET 110 having the high positive threshold voltage and PFET 120 having the high negative threshold voltage (e.g., for the signal blocking mode); and a fourth state with the NFET 110 having the high positive threshold voltage and the PFET 120 having the low negative threshold voltage (e.g., for the negative signal transmission mode).

It should be understood that if the NFET 110 and PFET 120 have more than two programmable threshold voltages, the device 100 can have more than four different device states and, thus, more than four different operating modes. For example, the NFET 110 could also have an ultra-low positive threshold voltage and the PFET 120 could have an ultra-low negative threshold voltage. In this case, additional device states can include: a fifth state with the NFET 110 having the ultra-low positive threshold voltage and PFET 120 having the ultra-low negative threshold voltage (e.g., for an alternative signal transmission mode); a sixth state with the NFET 110 having the ultra-low positive threshold voltage and the PFET 120 having a low negative threshold voltage; and so on.

FIG. 3 is a table illustrating exemplary sets of voltage conditions that could be employed to reconfigure a device 100 that includes an N-type FeFET 110 and a P-type FeFET 120, which are electrically connected in parallel and which have electrically connected gates. Specifically, this table illustrates exemplary voltage conditions that can be applied to the input node 140 (i.e., to the gates (G1/G2), to the NFET programming node 151 (i.e., to the first body (B1) of the N-type FeFET 110), and to the PFET programming node 152 (i.e., to the second body (B2) of the P-type FeFET 120) in order to achieve the above-mentioned devices states and operating modes.

For example, to reconfigure the device 100 so that it is in the first device state for the frequency multiplication mode at process step 604, the input node 140 can be discharged to ground, a specific negative voltage (e.g., −4V) can be applied to the NFET programming node 151, and a corresponding positive voltage (e.g., +4V) can be applied to the PFET programming node 152. As a result, the direction of polarization vector in the ferroelectric layer of the first gate (G1) will force electrons into the first channel region (C1) ensuring that the N-type FeFET 110 has a low positive threshold voltage. Additionally, the direction of polarization vector in the ferroelectric layer of the second gate (G2) will force holes into the second channel region (C2) ensuring that the P-type FeFET 120 has a low negative threshold voltage. As indicated by FIGS. 4A-1 and 4A-2, this first device state enables two times frequency multiplication for the parabolic part of the drain current-to-gate voltage curve. This example specifically illustrates how the disclosed method achieves frequency multiplication without requiring a device that consumes significant chip space or power.

To reconfigure the device 100 so that it is in the second device state for the positive signal transmission mode at process step 604, the input node 140 can be discharged to ground, a specific negative voltage (e.g., −4V) can be applied to the NFET programming node 151, and the same negative voltage (e.g., −4V) can be applied to the PFET programming node 152. As a result, the direction of polarization vector in the ferroelectric layer of the first gate (G1) will force electrons into the first channel region (C1) ensuring that the N-type FeFET 110 has a low positive threshold voltage. However, the direction of polarization vector in the ferroelectric layer of the second gate (G2) will force holes out of the second channel region (C2) ensuring that the P-type FeFET 120 has a high negative threshold voltage. As indicated by FIGS. 4B-1 and 4B-2, this second device state facilitates blocking of the negative signal part and transmission of the positive signal part only.

To reconfigure the device 100 so that it is in the third device state for the signal blocking mode at process step 604, the input node 140 can be discharged to ground, a specific positive voltage (e.g., +4V) can be applied to the NFET programming node 151, and a corresponding negative voltage (e.g., −4V) can be applied to the PFET programming node 152. As a result, the direction of polarization vector in the ferroelectric layer of the first gate (G1) will force electrons out of the first channel region (C1) ensuring that the N-type FeFET 110 has a high positive threshold voltage. The direction of polarization vector in the ferroelectric layer of the second gate (G2) will force holes out of the second channel region (C2) ensuring that the P-type FeFET 120 has a high negative threshold voltage. As indicated by FIGS. 4C-1 and 4C-2, this third device state facilitates blocking of both the positive and negative signal parts.

To reconfigure the device 100 so that it is in the fourth device state for the negative signal transmission mode at process step 604, the input node 140 can be discharged to ground, a specific positive voltage (e.g., +4V) can be applied to the NFET programming node 151, and the same positive voltage (e.g., +4V) can be applied to the PFET programming node 152. As a result, the direction of polarization vector in the ferroelectric layer of the first gate (G1) will force electrons out of the first channel region (C1) ensuring that the N-type FeFET 110 has a high positive threshold voltage. However, the direction of polarization vector in the ferroelectric layer of the second gate (G2) will force holes into the second channel region (C2) ensuring that the P-type FeFET 120 has a low negative threshold voltage. As indicated by FIGS. 4D-1 and 4D-2, this fourth device state facilitates blocking of the positive signal part and transmission of the negative signal part only.

As mentioned above, the N-type FeFET 110 and the P-type FET 120 could have more than two possible programmable threshold voltages. For example, an N-type FeFET could also have an ultra-low positive threshold voltage and a P-type FeFET also have an ultra-low negative threshold voltage. In this case, to reconfigure the device 100 so that it is in a fifth state (e.g., for an alternative transmission mode) at process step 604, the input node 140 can be discharged to ground, a specific high negative voltage (i.e., a higher negative voltage than the negative voltage used for the first state, e.g., −5V) can be applied to the NFET programming node 151, and a corresponding high positive voltage (e.g., +5V) can be applied to the PFET programming node 152. As a result, the direction of polarization vector in the ferroelectric layer of the first gate (G1) will force electrons into the first channel region (C1) ensuring that the N-type FeFET 110 has an ultra-low positive threshold voltage. Additionally, the direction of polarization vector in the ferroelectric layer of the second gate (G2) will force holes into the second channel region (C2) ensuring that the P-type FeFET 120 has an ultra-low negative threshold voltage. As indicated by FIGS. 4E-1 and 4E-2, this fifth device state enables signal transmission along the linear part of the drain current-to-gate voltage curve. This example illustrates that different parts of the drain current-to-gate voltage curve can be accessed by different programming/ erase voltages.

Optionally, the method can also include concurrently reprogramming the threshold voltages of the NFET 110 and the PFET 120 (e.g., at any time in the field, as necessary) through the application of a different set of voltage conditions to achieve a different specific combination of threshold voltages in the two FETs 110, 120 and, thus, switch the device 100 to a different one of the multiple possible operating modes.

Additionally, it should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (S1) or oxygen to achieve N-type conductivity. Those skilled in the art will also recognize that different conductivity levels will depend upon the relative concentration levels of the dopant(s) in a given semiconductor region.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are embodiments of a reconfigurable complementary metal oxide semiconductor (CMOS) device with multiple different operating modes including, but not limited to, a frequency multiplication mode. The device can include an N-type field effect transistor (NFET) and a P-type field effect transistor (PFET), which are threshold voltage-programmable, which are connected in parallel, and which have electrically connected gates. With this configuration, the threshold voltages of the NFET and PFET can be concurrently programmed and the operating mode of the device can be set depending upon the specific combination of threshold voltages achieved in the NFET and PFET during programming. For example, if the NFET has a low positive threshold voltage and the PFET has a low negative threshold voltage, the device can operate in a frequency multiplication mode. Additionally, the threshold voltages of the NFET and PFET could be concurrently reprogrammed (e.g., in the field), as needed, to switch the operating mode of the device. Such a device can be relatively small (i.e., can consume a minimal amount of chip area) and can achieve frequency multiplication and other functions with minimal power consumption. Also disclosed above are embodiments of a method for forming the device and embodiments of a method for reconfiguring the device (i.e., for concurrently programming the NFET and PFET to set or switch operating modes).

What is claimed is:

1. A device comprising:
an N-type field effect transistor; and
a P-type field effect transistor,
wherein the N-type field effect transistor and the P-type field effect transistor comprise threshold voltage-programmable field effect transistors, are electrically connected in parallel between an output node and a ground node, and have electrically connected gates, and
wherein the electrically connected gates are further electrically connected to an input node.

2. The device of claim 1,
wherein the N-type field effect transistor comprises: a first body; in the first body, a first channel region positioned laterally between a first source region and a first drain region; and a first gate on the first channel region,
wherein the P-type field effect transistor comprises: a second body; within the second body, a second channel region positioned laterally between a second source region and a second drain region; and a second gate on the second channel region, and
wherein the device further comprises: the output node at a junction between the first drain region and the second source region, the ground node at a junction between the first source region and the second drain region, the input node at a junction between the first gate and the second gate, a first programming node at the first body, and a second programming node at the second body.

3. The device of claim 1,
wherein the N-type field effect transistor has multiple different programmable positive threshold voltages,
wherein the P-type field effect transistor has multiple different programmable negative threshold voltages, and
wherein the device has multiple different operating modes as a function of the multiple different programmable positive threshold voltages of the N-type field effect transistor and the multiple different programmable negative threshold voltages of the P-type field effect transistor.

4. The device of claim 3, wherein, the device operates in a specific one of the multiple different operating modes, the device exhibits a specific one of multiple different drain current-to-gate voltage curves.

5. The device of claim 1,
wherein the N-type field effect transistor has multiple different programmable positive threshold voltages comprising at least a low positive threshold voltage and a high positive threshold voltage,
wherein the P-type field effect transistor has multiple different programmable negative threshold voltages comprising at least a low negative threshold voltage and a high negative threshold voltage, and
wherein the device has at least four different device states comprising:
a first state with the N-type field effect transistor having the low positive threshold voltage and the P-type field effect transistor having the low negative threshold voltage;
a second state with the N-type field effect transistor having the low positive threshold voltage and the P-type field effect transistor having the high negative threshold voltage;
a third state with the N-type field effect transistor having the high positive threshold voltage and the P-type field effect transistor having the high negative threshold voltage; and
a fourth state with the N-type field effect transistor having the high positive threshold voltage and the P-type field effect transistor having the low negative threshold voltage.

6. The device of claim 5,
wherein the multiple different programmable positive threshold voltages of the N-type field effect transistor further comprise an ultra-low positive threshold voltage,
wherein the multiple different programmable negative threshold voltages of the P-type field effect transistor further comprise an ultra-low negative threshold voltage, and
wherein the device states further comprise a fifth state with the N-type field effect transistor having the ultra-low positive threshold voltage and the P-type field effect transistor having the ultra-low negative threshold voltage.

7. The device of claim 1, wherein the threshold voltage-programmable field effect transistors comprise any of ferroelectric field effect transistors, charge trap field effect transistors, and floating gate field effect transistors.

8. The device of claim 1, wherein the gates comprise different portions of a single gate structure.

9. A method comprising:
providing a substrate; and
forming a device on the substrate, wherein the forming of the device comprises forming an N-type field effect transistor and a P-type field effect transistor, wherein the N-type field effect transistor and the P-type field effect transistor comprise threshold voltage-programmable field effect transistors, are electrically connected in parallel between an output node and a ground node, and have electrically connected gates and wherein the electrically connected gates are further connected to an input node.

10. The method of claim 9,
wherein the N-type field effect transistor is formed so as to comprise: a first body; in the first body, a first channel region positioned laterally between a first source region and a first drain region; and a first gate on the first channel region,
wherein the P-type first effect transistor is formed so as to comprise: a second body; within the second body, a second channel region positioned laterally between a second source region and a second drain region; and a second gate on the second channel region, and
wherein the method further comprises forming contacts to the output node at a junction between the first drain region and the second drain region, the ground node at a junction between the first source region and the second drain region, the input node at a junction between the first gate and the second gate, a first programming node at the first body, and a second programming node at the second body.

11. The method of claim 9, wherein the threshold voltage-programmable field effect transistors comprise any of ferroelectric field effect transistors, charge trap field effect transistors, and floating gate field effect transistors.

12. The method of claim 9, wherein the forming of the N-type field effect transistor and the P-type field effect transistor comprises forming a single gate structure over a first channel region for the N-type field effect transistor and over a second channel region for the P-type field effect transistor such that the gates comprise different portions of the single gate structure.

13. A device comprising:
an N-type field effect transistor; and
a P-type field effect transistor,
wherein the N-type field effect transistor and the P-type field effect transistor comprise threshold voltage-programmable field effect transistors, are electrically connected in parallel and have electrically connected gates,
wherein the N-type field effect transistor comprises: a first body; in the first body, a first channel region positioned laterally between a first source region and a first drain region; and a first gate on the first channel region,
wherein the P-type field effect transistor comprises: a second body; within the second body, a second channel region positioned laterally between a second source region and a second drain region; and a second gate on the second channel region, and
wherein the device further comprises: an output node at a junction between the first drain region and the second source region, a ground node at a junction between the first source region and the second drain region, an input node at a junction between the first gate and the second gate, a first programming node at the first body, and a second programming node at the second body.

14. The device of claim 13,
wherein the N-type field effect transistor has multiple different programmable positive threshold voltages,
wherein the P-type field effect transistor has multiple different programmable negative threshold voltages, and wherein the device has multiple different operating modes as a function of the multiple different programmable positive threshold voltages of the N-type field effect transistor and the multiple different programmable negative threshold voltages of the P-type field effect transistor.

15. The device of claim 14, wherein, the device operates in a specific one of the multiple different operating modes, the device exhibits a specific one of multiple different drain current-to-gate voltage curves.

16. The device of claim 13,
wherein the N-type field effect transistor has multiple different programmable positive threshold voltages comprising at least a low positive threshold voltage and a high positive threshold voltage,
wherein the P-type field effect transistor has multiple different programmable negative threshold voltages comprising at least a low negative threshold voltage and a high negative threshold voltage, and
wherein the device has at least four different device states comprising:
  a first state with the N-type field effect transistor having the low positive threshold voltage and the P-type field effect transistor having the low negative threshold voltage;
  a second state with the N-type field effect transistor having the low positive threshold voltage and the P-type field effect transistor having the high negative threshold voltage;
  a third state with the N-type field effect transistor having the high positive threshold voltage and the P-type field effect transistor having the high negative threshold voltage; and
  a fourth state with the N-type field effect transistor having the high positive threshold voltage and the P-type field effect transistor having the low negative threshold voltage.

17. The device of claim 16,
wherein the multiple different programmable positive threshold voltages of the N-type field effect transistor further comprise an ultra-low positive threshold voltage,
wherein the multiple different programmable negative threshold voltages of the P-type field effect transistor further comprise an ultra-low negative threshold voltage, and
wherein the device states further comprise a fifth state with the N-type field effect transistor having the ultra-low positive threshold voltage and the P-type field effect transistor having the ultra-low negative threshold voltage.

18. The device of claim 13, wherein the threshold voltage-programmable field effect transistors comprise any of ferroelectric field effect transistors, charge trap field effect transistors, and floating gate field effect transistors.

19. The device of claim 13, wherein the gates comprise different portions of a single gate structure.

* * * * *